United States Patent
Lipson et al.

(10) Patent No.: US 9,153,715 B2
(45) Date of Patent: Oct. 6, 2015

(54) POLYSILICON PHOTODETECTOR, METHODS AND APPLICATIONS

(71) Applicant: CORNELL UNIVERSITY, Ithaca, NY (US)

(72) Inventors: Michal Lipson, Ithaca, NY (US); Kyle Preston, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 0 days.

(21) Appl. No.: 14/512,738

(22) Filed: Oct. 13, 2014

(65) Prior Publication Data

US 2015/0129752 A1 May 14, 2015

Related U.S. Application Data

(63) Continuation of application No. 13/398,132, filed on Feb. 16, 2012, now Pat. No. 8,861,909.

(60) Provisional application No. 61/443,769, filed on Feb. 17, 2011.

(51) Int. Cl.
  *G02B 6/26* (2006.01)
  *H01L 31/0232* (2014.01)
  (Continued)

(52) U.S. Cl.
  CPC .............. *H01L 31/02327* (2013.01); *G01J 1/42* (2013.01); *G02B 6/12004* (2013.01);
  (Continued)

(58) Field of Classification Search
  CPC ........... G02B 6/29335; G02B 6/29338; G02B 6/29341; G02B 6/29343; H01L 31/03682
  See application file for complete search history.

(56) References Cited

U.S. PATENT DOCUMENTS

| 4,431,858 A | 2/1984 | Gonzalez et al. |
| 5,534,445 A | 7/1996 | Tran et al. |

(Continued)

FOREIGN PATENT DOCUMENTS

WO     2004107032 A1    12/2004

OTHER PUBLICATIONS

Bergman, Keren; Silicon Photonics for Exascale Computing; Columbia University; Lightware Research Laboratory; 2011; http://www.orau.gov/archl2011/presentations/bergmank.pdf.

(Continued)

*Primary Examiner* — Rhonda Peace (74) *Attorney, Agent, or Firm* — William Greener; Alek P. Szecsy; Bond, Schoeneck & King, PLLC (57) ABSTRACT

A silicon photonic photodetector structure, a method for fabricating the silicon photonic photodetector structure and a method for operating a silicon photonic photodetector device that results from the photonic photodetector structure each use a strip waveguide optically coupled with a polysilicon material photodetector layer that may be contiguous with a semiconductor material slab to which is located and formed a pair of electrical contacts separated by the polysilicon material photodetector layer. Alternatively, the pair of electrical contacts may be located and formed upon separated locations of the polysilicon photodetector layer. Within the foregoing silicon photonic photodetector structure and related methods the polysilicon material photodetector layer includes defect states suitable for absorbing an optical signal from the strip waveguide and generating an electrical output signal using at least one of the electrical contacts when the optical signal includes a photon energy less than a band gap energy of a polysilicon material from which is comprised the polysilicon material photodetector layer. Alternatively, the silicon photonic photodetector structure may include appropriate photodetection circuitry. The silicon photonic photodetector structure and related methods avoid the use of germanium and indium phosphide-based materials.

22 Claims, 9 Drawing Sheets

(51) Int. Cl.
*G02B 6/293* (2006.01)
*G02B 6/12* (2006.01)
*H01L 31/0352* (2006.01)
*H01L 31/0368* (2006.01)
*H01L 31/105* (2006.01)
*G01J 1/42* (2006.01)
*H01L 31/09* (2006.01)
*H01L 31/18* (2006.01)
*G02B 6/42* (2006.01)

(52) U.S. Cl.
CPC ..... *G02B 6/29341* (2013.01); *H01L 31/03682* (2013.01); *H01L 31/035281* (2013.01); *H01L 31/09* (2013.01); *H01L 31/105* (2013.01); *H01L 31/182* (2013.01); *Y02E 10/546* (2013.01)

(56) References Cited

U.S. PATENT DOCUMENTS

| | | | |
|---|---|---|---|
| 6,534,759 B1 | 3/2003 | Koscielniak et al. | |
| 6,670,657 B2 | 12/2003 | Menut et al. | |
| 6,764,883 B1 | 7/2004 | Dokumaci et al. | |
| 6,897,498 B2 | 5/2005 | Gothoskar et al. | |
| 7,120,350 B2 | 10/2006 | Block | |
| 7,176,048 B1 | 2/2007 | Burns | |
| 7,266,263 B2 | 9/2007 | Ahn | |
| 7,305,157 B2 | 12/2007 | Ahn | |
| 7,358,585 B2 | 4/2008 | Patel et al. | |
| 7,386,207 B2 | 6/2008 | Knights | |
| 7,397,101 B1 | 7/2008 | Masini et al. | |
| 7,447,387 B2 | 11/2008 | Shih et al. | |
| 7,515,793 B2 | 4/2009 | Dehlinger | |
| 7,536,070 B2 | 5/2009 | Rosa de Almeida et al. | |
| 7,599,584 B2 | 10/2009 | Hu et al. | |
| 7,605,391 B2 | 10/2009 | Burns | |
| 7,622,320 B2 | 11/2009 | Song | |
| 7,668,420 B2 | 2/2010 | Wu et al. | |
| 7,692,261 B2 | 4/2010 | Hara et al. | |
| 7,720,320 B2 | 5/2010 | Shih et al. | |
| 7,800,193 B2 | 9/2010 | Fujikata et al. | |
| 7,826,700 B2 | 11/2010 | Knights et al. | |
| 7,941,014 B1 | 5/2011 | Watts et al. | |
| 7,952,159 B2* | 5/2011 | Weng et al. | 257/458 |
| 8,067,277 B2 | 11/2011 | Deane | |
| 8,326,094 B2 | 12/2012 | Knights et al. | |
| 8,369,658 B2 | 2/2013 | Knights et al. | |
| 8,861,909 B2* | 10/2014 | Lipson et al. | 385/40 |
| 2004/0120638 A1 | 6/2004 | Frick | |
| 2005/0057671 A1 | 3/2005 | Cole et al. | |
| 2006/0039666 A1 | 2/2006 | Knights et al. | |
| 2006/0118781 A1 | 6/2006 | Rhodes | |
| 2008/0056636 A1 | 3/2008 | Shih et al. | |
| 2009/0010587 A1 | 1/2009 | Shih et al. | |
| 2009/0032805 A1 | 2/2009 | Ty Tan et al. | |
| 2009/0057796 A1 | 3/2009 | Bach et al. | |
| 2009/0078963 A1 | 3/2009 | Khodja | |
| 2009/0184384 A1 | 7/2009 | Sanfilippo et al. | |
| 2010/0116976 A1 | 5/2010 | Wober | |
| 2010/0213466 A1 | 8/2010 | Hirschman et al. | |
| 2011/0069969 A1 | 3/2011 | Hochberg et al. | |
| 2011/0170821 A1 | 7/2011 | Lipson et al. | |
| 2011/0293216 A1 | 12/2011 | Lipson et al. | |
| 2011/0294253 A1 | 12/2011 | Shiu et al. | |
| 2011/0303898 A1 | 12/2011 | Tian et al. | |
| 2012/0213468 A1 | 8/2012 | Lipson et al. | |
| 2012/0243828 A1 | 9/2012 | Suzuki | |
| 2013/0056623 A1 | 3/2013 | Lipson et al. | |

OTHER PUBLICATIONS

Biberman et al.; High-Speed Data Transmission in Multi-Layer Deposited Silicon Photonics for Advanced Photonic Networks-on-Chip; Columbia University; 2011; http://lightwave.ee.columbia.edu/files/Biberman2011d.pdf.

Kimerling et al.; Electronic-photonic integrated circuits on the CMOS platform; Massachusetts Institute of Technology; 2006; http://lib.semi.ac.cn:8080/tsh/dzzy/wsqk/spie/vol612502.pdf.

* cited by examiner

POLYSILICON PHOTODETECTOR, METHODS AND APPLICATIONS

CROSS-REFERENCE TO RELATED APPLICATIONS

This application is a continuation application that is related to, and derives priority from, U.S. patent application Ser. No. 13/398,132, filed 16 Feb. 2012 and titled "Polysilicon Photodetector, Methods and Applications," which in turn is related to, and derives priority from, U.S. Provisional Patent Application Ser. No. 61/443,769, filed 17 Feb. 2011 and titled "Photodiode in Deposited Silicon Apparatus, Method, and Application," the contents of which are incorporated herein fully by reference.

BACKGROUND

1. Field of the Invention

Embodiments relate generally to photodetector structures and photodetector devices, such as but not limited to photodiode structures and photodiode devices, within photonic circuits. More particularly, embodiments relate to integration of photodetector structures and photodetector devices, such as but not limited to photodiode structures and photodiode devices, with additional structures and additional devices within photonic circuits.

2. Description of the Related Art

The monocrystalline silicon-on-insulator (SOI) platform enables signal modulation and low-loss waveguiding in the telecommunication wavelength signal bands centered at $\lambda=1.3$ μm and 1.55 μm. These modulation and waveguiding functions can be implemented due to a 1.12 eV bandgap of bulk monocrystalline Si, which only produces significant linear absorption for $\lambda<1.1$ μm. To add infrared (IR) telecommunication wavelength photodetection capabilities to silicon photonic circuits, other non-silicon materials typically must be added. Compound semiconductors such as indium phosphide-based materials may be heterogeneously integrated with silicon photonic circuits, but more-desirable monolithic integration is limited due to material restrictions in complementary metal-oxide semiconductor (CMOS) processing environments. In contrast, germanium may be monolithically integrated as an absorbing material in CMOS processing environments. However, epitaxial growth of Ge-on-Si requires complex processing steps to manage a 4% lattice mismatch between a germanium crystal structure and a silicon crystal structure.

Given a continued interest in IR telecommunication wavelength signal photodetection within silicon photonic circuits, desirable are additional silicon photonic structures, silicon photonic devices and related methods that provide for IR telecommunication wavelength photodetection while providing for ready fabrication while using conventional silicon photonic structure fabrication processes and conventional silicon photonic structure fabrication methodology.

SUMMARY

Embodiments include: (1) silicon photonic photodetector structures such as but not limited to photodiode structures, compatible with a silicon photonic circuit; (2) methods for fabricating the silicon photonic photodetector structures, such as but not limited to the photodiode structures, compatible with the silicon photonic circuit; and (3) methods for operating a silicon photonic photodetector device, such as but not limited to a photodiode device, that results from the silicon photonic photodetector structures. Within the context of the foregoing silicon photonic photodetector structures and related methods a silicon photonic photodetector structure comprises a strip waveguide located and formed over a substrate and optically coupled with a polysilicon material photodetector layer (i.e., generally but not exclusively a photodiode photodetector layer) also located and formed over the substrate. The polysilicon material photodetector layer may be contiguous with (i.e., at least electrically connected with, and preferably formed from the same material layer as) a semiconductor material slab to which is located and formed a pair of electrical contacts that is separated by the polysilicon material photodetector layer. Within the foregoing silicon photonic photodetector structure and related methods, the polysilicon material photodetector layer contains defect states suitable for absorbing an optical input signal from the strip waveguide and generating an electrical output signal using at least one of the pair of electrical contacts, when the particular optical input signal within the strip waveguide also contains a photon energy less than the polysilicon material photodetector layer band gap energy. In addition, the foregoing structures and methods may also include located and formed over the same substrate as the strip waveguide, the polysilicon material photodetector layer and the electrical contacts circuitry adapted to detect an electrical output signal using the at least one of the pair of electrical contacts when introducing an optical signal at the strip waveguide.

Within the silicon photonic photodiode structure in accordance with the embodiments, when an IR telecommunications wavelength signal (i.e., which may be multiplexed) is introduced into the strip waveguide, a photodiode (or alternate photodetector) photodetection signal (i.e., which may be demultiplexed) may be measured using at least one of the electrical contacts.

A method for fabricating a silicon photonic photodiode structure in accordance with the embodiments may include specific structural features that are included within the foregoing silicon photonic photodetector structure.

A method for operating a silicon photonic photodetector device that results from the silicon photonic photodetector structure in accordance with the embodiments includes introducing the optical signal at the strip waveguide while measuring a photodetection electrical signal using at least one of the electrical contacts.

A silicon photonic photodetector structure in accordance with the embodiments, a method for fabricating the silicon photonic photodetector structure in accordance with the embodiments and a method for operating the silicon photonic photodetector device that derives from the silicon photonic photodetector structure in accordance with the embodiments are desirable insofar as the polysilicon material from which is comprised the silicon photonic photodetector structure is readily deposited using deposition processing that is otherwise generally conventional in the silicon photonic circuit fabrication art, and thus germanium processes and germanium photodetector structures and devices (or other non-silicon materials, processes, structures and devices, such as but not limited to indium phosphide materials, processes, structures and devices) may be avoided.

Most broadly, embodiments of a silicon photonic structure, a method for fabricating the silicon photonic structure and a method for operating a silicon photonic device that derives from the silicon photonic structure include: (1) a strip waveguide located and formed over the substrate; (2) a polysilicon material photodetector layer also located and formed over the substrate and optically coupled with the strip waveguide; and (3) a pair of electrical contacts located and formed contacting separated (i.e., normally by the strip waveguide) portions of the polysilicon material photodetector layer. The silicon photonic structure and related methods also include at least one of: (1) the foregoing polysilicon material photodetector layer defect states suitable for absorbing an optical input signal from the strip waveguide and generating an electrical output signal using at least one of the pair of electrical contacts, when the particular optical input signal within the strip waveguide also contains a photon energy less than the polysilicon material photodetector layer band gap energy limitation, as described above; and (2) the foregoing circuitry adapted to detect an electrical output signal using the at least one of the pair of electrical contacts when introducing an optical signal at the strip waveguide limitation, as also described above.

Additional more specific embodiments are described as follows.

A particular photonic structure in accordance with the embodiments includes a strip waveguide located over a substrate. The particular photonic structure also includes a polysilicon material photodetector layer also located over the substrate and optically coupled with the strip waveguide. The polysilicon material photodetector layer is contiguous with a semiconductor material slab also located over the substrate. The particular photonic structure also includes a pair of electrical contacts contacting portions of the semiconductor material slab separated by the polysilicon material photodetector layer. The polysilicon material photodetector layer includes defect states suitable for absorbing an optical signal from the strip waveguide and generating an electrical output signal using at least one of the electrical contacts when the optical signal includes a photon energy less than a band gap energy of a polysilicon material from which is comprised the polysilicon material photodetector layer.

Another particular photonic structure in accordance with the embodiments includes a strip waveguide located over a substrate. This other particular photonic structure also includes a polysilicon material photodetector layer also located over the substrate and optically coupled with the strip waveguide. The polysilicon material photodetector layer is contiguous with a semiconductor material slab also located over the substrate. This other particular photonic structure also includes a pair of electrical contacts contacting portions of the semiconductor material slab separated by the polysilicon material photodetector layer. This other particular photonic structure also includes circuitry located over the substrate and connected to the pair of electrical contacts, and adapted to detect an electrical output signal using at least one of the pair of electrical contacts when introducing an optical signal at the strip waveguide.

A particular method for fabricating a photonic device includes forming over a substrate a strip waveguide. The particular method also includes forming over the substrate a polysilicon material photodetector layer contiguous with a semiconductor material slab. The particular method also includes forming over the substrate and contacting portions of the semiconductor material slab separated by the polysilicon material photodetector layer a pair of electrical contacts. The polysilicon material photodetector layer is formed with defect states suitable for absorbing an optical signal from the strip waveguide and generating an electrical output signal using at least one of the electrical contacts when the optical signal includes a photon energy less than a band gap energy of a polysilicon material from which is comprised the polysilicon material photodetector layer.

Another particular method for fabricating a photonic device includes forming over a substrate a strip waveguide. This other particular method also includes forming over the substrate a polysilicon material photodetector layer optically coupled with the strip waveguide and contiguous with a semiconductor material slab also formed over the substrate. This other particular method also includes forming over the substrate and contacting portions of the semiconductor material slab separated by the polysilicon material photodetector layer a pair of electrical contacts. This other particular method also includes forming over the substrate and connected to the pair of electrical contacts circuitry adapted to detect an electrical output signal using at least one of the pair of electrical contacts when introducing an optical signal at the strip waveguide.

A particular method for operating a photonic device includes providing a photonic structure including: (1) a strip waveguide located over a substrate; (2) a polysilicon material photodetector layer also located over the substrate and optically coupled with the strip waveguide, the polysilicon material photodetector layer contiguous with a semiconductor material slab also located over the substrate; and (3) a pair of electrical contacts contacting portions of the semiconductor material slab separated by the polysilicon material photodetector layer, the polysilicon material photodetector layer including defect states suitable for absorbing an optical signal from the strip waveguide and generating an electrical output signal using at least one of the electrical contacts when the optical signal includes a photon energy less than a band gap energy of a polysilicon material from which is comprised the polysilicon material photodetector layer. The method also includes introducing an optical signal into the strip waveguide, the optical signal including the photon energy less than the bandgap of the polysilicon material from which is comprised the polysilicon material photodetector layer. The method also includes measuring the electrical output signal while using the at least one of the electrical contacts.

Another particular method for operating a photonic device includes providing a photonic structure comprising: (1) a strip waveguide located over a substrate; (2) a polysilicon material photodetector layer also located over the substrate and optically coupled with the strip waveguide, the polysilicon material photodetector layer contiguous with a semiconductor material slab also located over the substrate; (3) a pair of electrical contacts contacting portions of the semiconductor material slab separated by the polysilicon material detector layer; and (4) circuitry adapted to detect an electrical output signal using at least one of the pair of electrical contacts when introducing an optical signal at the strip waveguide. This other particular method also includes introducing an optical signal into the strip waveguide. This other particular method also includes measuring the electrical output signal while using the at least one of the electrical contacts.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, which form a material part of this disclosure, wherein.

DETAILED DESCRIPTION OF THE EMBODIMENTS

Embodiments provide silicon photonic photodetector structures, methods for fabricating the silicon photonic photodetector structures and methods for operating a silicon photonic photodetector device that results from the silicon photonic photodetector structures. Within the context of the foregoing silicon photonic photodetector structures, methods for fabricating the silicon photonic photodetector structures and methods for operating the silicon photonic photodetector devices that result from the silicon photonic photodetector structures, there is employed a strip waveguide located and formed over a substrate that is optically coupled to a polysilicon material photodetector layer that is also located and formed over the substrate. The polysilicon material photodetector layer may be located and formed contiguous with a semiconductor material slab to which is located and formed a pair of electrical contacts at positions separated by the polysilicon material photodetector layer. Within the foregoing embodiments, the polysilicon material photodetector layer may be tuned for photodiode photodetection characteristics by incorporation of a comparatively lightly doped dopant that provides for a photodiode photodetection effect within the polysilicon material photodetector layer.

While the embodiments illustrate a silicon photonic photodetector structure and related methods within the context of a silicon photonic photodiode structure and related methods, the embodiments are not intended to be so limited, and to that end also may be included are other photodetector devices that may be formed from polysilicon material photodetector layers. Such other photodetector devices may include, but are not necessarily limited to, charge-coupled devices, phototransistors, and avalanche photodiodes.

Similarly, while the embodiments most commonly illustrate a silicon photonic photodetector structure and related methods that include a semiconductor material slab for supporting a polysilicon material photodetector layer, this also is not intended to limit the embodiments. Rather, the embodiments also illustratively include an example where a polysilicon material photodetector layer is located and formed conformal to a strip waveguide which in turn is located and formed upon or over a substrate absent a specifically denominated semiconductor material slab. In the presence of the semiconductor material slab, electrical contacts are commonly located and formed to the semiconductor material slab at locations separated by the polysilicon material photodetector layer. In the absence of the semiconductor material slab, electrical contacts are typically located and formed at locations of the polysilicon material photodetector layer separated by a strip waveguide.

1. Basic Structural Elements and Features of the Silicon Photonic Photodiode Structure FIG. 1(a) and FIG. 1(b) show, respectively, an optical microscopy plan-view image and a corresponding schematic cross-sectional diagram of a silicon photonic photodiode structure in accordance with the embodiments.

Figure 1A:
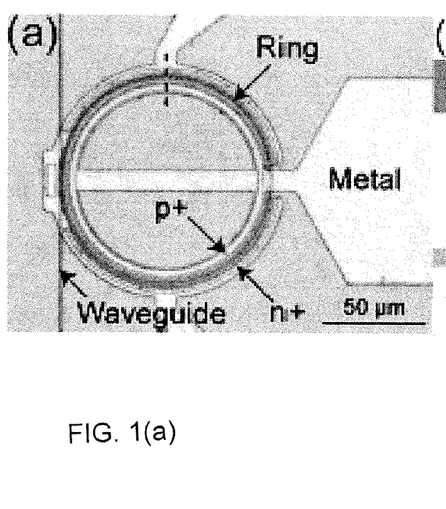
FIG. 1a and FIG. 1b show, respectively, an optical microscopy plan-view image and a corresponding schematic cross-sectional diagram of a silicon photonic photodiode structure in accordance with the embodiments.
Figure 1B:
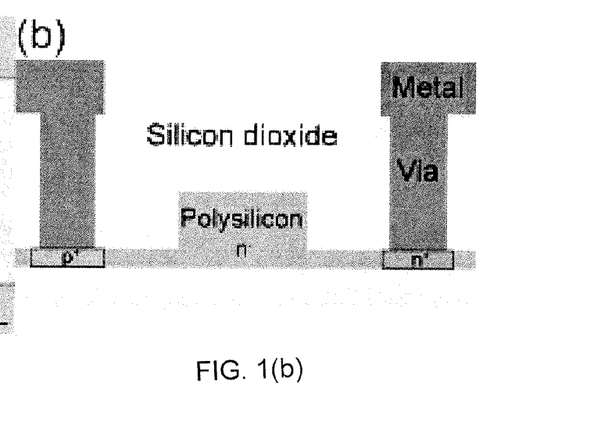

As is illustrated within the optical microscopy plan-view image of FIG. 1(a), a silicon photonic photodiode structure in accordance with the embodiments includes a strip waveguide (i.e., at left hand side of FIG. 1(a) and designated as "waveguide") operatively optically coupled to a polysilicon material photodetector layer in the form of a ring waveguide (designated as "ring") to the right of the strip waveguide and closer to the center of the optical microscopy plan-view image of FIG. 1(a). Within the silicon photonic photodiode structure whose optical microscopy image is illustrated in FIG. 1(a), the strip waveguide has a linewidth from about 300 to about 700 nanometers and a thickness from about 100 to about 600 nanometers. In addition, the ring waveguide has a linewidth from about 300 to about 2000 nanometers and a thickness from about 100 to about 600 nanometers, as well as a ring radius from greater than about 30 to about 70 microns, more preferably from about 40 to about 60 microns and yet more preferably from about 45 to about 55 microns.

The optical microscopy plan-view diagram of FIG. 1(a) also shows a comparatively heavily doped p+ region interior to and at least in part coaxial with the ring waveguide, and a comparatively heavily doped n+ region exterior to and at least in part coaxial with the ring waveguide. Further details regarding the foregoing p+ and n+ regions will be discussed within the context of additional drawings that follow.

Finally, FIG. 1(a) shows: (1) at the upper and lower portions of the optical microscopy plan-view image metal contact layers to the comparatively heavily doped exterior n+ region; and (2) at the right hand side a generally larger metal contact (designated as "metal") that serves as a contact point to the comparatively heavily doped interior p+ region.

FIG. 1(b) shows a schematic cross-sectional diagram illustrating the silicon photonic photodiode structure whose optical microscopy plan-view image is illustrated in FIG. 1(a). The schematic cross-sectional diagram of FIG. 1(b) is taken through a cross-section that corresponds with the dashed line that includes the comparatively heavily doped p+ region, the ring waveguide and the comparatively heavily doped n+ region at the metal contact layer that is not otherwise designated at the top central portion within the silicon photonic photodiode structure whose optical microscopy plan-view image is illustrated in FIG. 1(a). As is illustrated within FIG. 1(b), and as will be discussed in further detail below, a silicon photonic photodiode structure in accordance with the embodiments includes as the ring waveguide a comparatively lightly doped polysilicon material mesa (designated as "polysilicon n−") that is contiguous with (i.e., electrically contiguous with), extends from and rises above a semiconductor material slab which in general comprises the same lightly doped polysilicon material as the lightly doped polysilicon material mesa (i.e., generally but not exclusively n− at about 1E14 to less than about 1E18 dopant atoms per cubic centimeter). The semiconductor material slab further includes, separated by the comparatively lightly doped polysilicon material mesa, a pair of comparatively heavily doped contact regions, one of the same including an n+ dopant type and the other including a p+ dopant type. As is illustrated within the schematic cross-sectional diagram of FIG. 1(b), the silicon photonic photodiode structure is passivated with a silicon oxide material layer into which is formed apertures to accommodate a plurality of vias (i.e., electrical contacts) that contact the comparatively heavily doped n+ and p+ regions, and to which vias are also connected metallization layers that allow for a photodetection output signal to be measured while using at least one of the comparatively heavily doped p+ and n+ regions that comprise in-part a silicon photonic photodiode structure in accordance with the embodiments. Thus, the embodiments also are intended to include specific circuitry that adapts the silicon photonic photodetector apparatus in accordance with the embodiments to use as a photodetection apparatus (i.e., an optical absorption and electrical conversion apparatus) rather than alternative photonic apparatus.

Thus, in operation of a silicon photonic photodiode device that derives from the silicon photonic photodiode structure in accordance with the embodiment as illustrated within the optical microscopy plan-view diagram of FIG. 1(a) and the schematic cross-sectional diagram of FIG. 1(b), an optical signal is introduced into the strip waveguide and an electrical photodetection output signal may be measured while using at least one of the two comparatively highly doped p+ and n+ regions (or alternatively at electrical contacts located and formed connected to the comparatively highly doped p+ and n+ regions).

Moreover, while the embodiments as illustrated within the optical microscopy plan-view image of FIG. 1(a) and the schematic cross-sectional diagram of FIG. 1(b) illustrate the embodiments within the context of a strip waveguide optically coupled to a ring waveguide located and formed coplanar, such relative disposition of the strip waveguide and the ring waveguide is not intended to limit the embodiments. Rather, the strip waveguide (or an alternative geometric form waveguide that may alternatively be characterized and regarded as a bus waveguide) may be located and formed in any of several geometric dispositions with respect to a ring waveguide in accordance with the embodiments provided that the strip waveguide (or alternative geometric form waveguide) and the ring waveguide are appropriately optically coupled, which within the context of IR telecommunications wavelength desirable within the context of the embodiments is a separation distance from about 100 to about 1000 nanometers, dependent on the refractive indices of the materials in use. Thus, the embodiments also contemplate a silicon photonic photodetector structure where a strip waveguide and a ring waveguide are coplanar or alternatively where a strip waveguide is located and formed vertically separated either above or below a ring waveguide.

Moreover, while the optical microscopy plan-view image of FIG. 1(a) and the schematic cross-sectional diagram of FIG. 1(b) illustrate the embodiments within the context of a strip waveguide and a ring waveguide each of which may comprise polysilicon, the embodiments are again also not intended to be so limited. Rather, while the embodiments contemplate that the ring waveguide comprises a polysilicon material, the semiconductor material slab with which the ring waveguide is contiguous and extends from, as well as the strip waveguide, may comprise other materials (i.e., such as but not limited to monocrystalline silicon materials, amorphous silicon materials, silicon nitride materials, silicon oxynitride materials and polymer materials) that may provide greater fidelity within the context of optical and electrical performance of a silicon photonic photodiode device that results from operation of a silicon photonic photodiode structure in accordance with the embodiments.

Finally, although the embodiments as illustrated within the optical microscopy plan-view diagram of FIG. 1(a) and the schematic cross-sectional diagram of FIG. 1(b) illustrate a photonic structure that includes a silicon photonic photodiode structure including a single ring waveguide, this particular photonic structure also is not intended to limit the embodiments. Rather, the embodiments also contemplate that multiple ring waveguides of the same dimensions as described above may be operatively coupled to a single strip waveguide.

In addition, the embodiments also contemplate that ring waveguides of different ring radii may also be coupled to the same or different strip waveguides to provide photonic structures in accordance with the embodiments. In that regard, a silicon photonic structure in accordance with the embodiments may include a silicon photonic ring resonator structure that provides a silicon photonic modulator structure, as well as a silicon photonic photodiode structure. Such photonic ring resonator structures within the context of modulator structures are described in greater detail in U.S. Patent Application Publication No. 2011/0293216, the content of which is incorporated herein fully by reference.

2. Fabrication Methodology for the Silicon Photonic Photodiode Structure

Figure 2A:
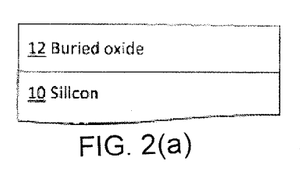
FIG. 2a to FIG. 2i show a series of schematic cross-sectional diagrams illustrating the results of progressive stages in fabricating a silicon photonic photodiode structure in accordance with the embodiments.

FIG. 2(a) to FIG. 2(j) show a series of schematic cross-sectional diagrams illustrating the results of progressive stages in fabricating a silicon photonic photodiode structure in accordance with the embodiments, as illustrated within the optical microscopy plan-view diagram of FIG. 1(a) and the schematic cross-sectional diagram of FIG. 1(b). FIG. 2(a) shows a schematic cross-sectional diagram of the silicon photonic photodiode structure at an early stage in the fabrication thereof in accordance with the embodiments.

FIG. 2(a) first shows a silicon substrate 10 having located and formed thereupon a buried oxide layer 12. Within the embodiments, the silicon substrate 10 and the buried oxide layer 12 may be otherwise generally conventional in the silicon photonic structure fabrication art and the optoelectronic structure fabrication art. Typically, the silicon substrate 10 comprises a silicon semiconductor material that may include either an n type dopant or a p type dopant, and any of several dopant concentrations. Typically, the silicon substrate 10 may also include located and formed therein and/or thereupon semiconductor devices as are otherwise generally conventional, such semiconductor devices including but not limited to resistors, transistors, diodes and capacitors.

The buried oxide 12 may in general comprise any of several dielectric materials, such as but not limited to silicon oxide dielectric materials, silicon nitride dielectric materials and silicon oxynitride dielectric materials, but more specifically comprises a silicon oxide dielectric material when the silicon substrate 10 comprises a silicon semiconductor material. Under such circumstances, the buried oxide layer 12 may be formed using any of several methods, including but not limited to thermal annealing methods, chemical vapor deposition methods and physical vapor deposition methods. Typically, the buried oxide layer 12 comprises a thermal silicon oxide dielectric material located and formed upon the silicon substrate 10 to a thickness from about 1 to about 5 microns.

Figure 2B:
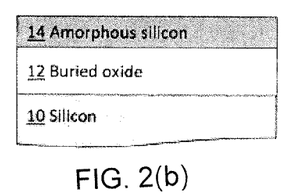

FIG. 2(b) shows the results of locating and forming an amorphous silicon layer 14 upon the buried oxide layer 12 within the silicon photonic photodiode structure of FIG. 2(a). The amorphous silicon layer 14 may be located and formed upon the buried oxide layer 12 within the silicon photonic photodiode structure whose schematic cross-sectional diagram is illustrated in FIG. 2(a) to provide the silicon photonic photodiode structure whose schematic cross-sectional diagram is illustrated in FIG. 2(b) while using methods as are generally conventional in the silicon photonic fabrication art and the optoelectronic fabrication art. Typically, the amorphous silicon layer 14 is located and formed upon the buried oxide layer 12 to a thickness from about 100 to about 600 nanometers. While the amorphous silicon layer 14 as illustrated within the schematic cross-sectional diagram of FIG. 2(b) may be formed with a co-deposited dopant, the present process sequence does not particularly indicate or suggest that particular type of process sequence. Generally, the amorphous silicon layer 14 may be formed using methods including but not limited to chemical vapor deposition methods and physical vapor deposition methods.

Figure 2C:
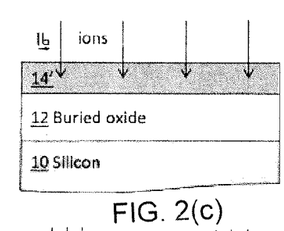

FIG. 2(c) shows the results of ion implanting the amorphous silicon layer 14 that is illustrated within the schematic cross-sectional diagram of FIG. 2(b) with a dose of dopant ions 16 to form a doped amorphous silicon layer 14' from the amorphous silicon layer 14 that is illustrated in FIG. 2(b). While the doped amorphous silicon layer 14' may comprise either an n or p dopant, the doped amorphous silicon layer 14' is typically located and formed upon the buried oxide layer 12 including an n-dopant (i.e., an arsenic or phosphorus dopant) to provide a comparatively lightly doped n− volume concentration from about 1E14 to less than about 1E18 n-dopant atoms per cubic centimeter within the doped amorphous silicon layer 14'.

Figure 2D:
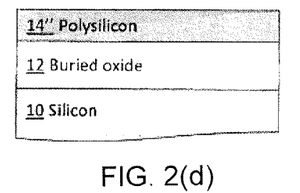

FIG. 2(d) shows the results of thermally annealing the silicon photonic photodiode structure of FIG. 2(c) to provide from the doped amorphous silicon layer 14' a doped polysilicon layer 14". Such a doped polysilicon layer 14" may be formed from the doped amorphous silicon layer 14' by thermal annealing at a temperature from about 1000 to about 1200 degrees centigrade for a time period from about 300 to about 600 minutes, in an inert atmosphere, such as but not limited to a nitrogen atmosphere.

Figure 2E:
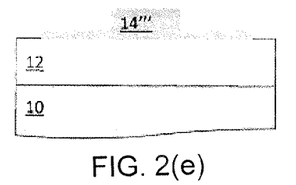

FIG. 2(e) shows the results of patterning the doped polysilicon layer 14" within the schematic cross-sectional diagram of FIG. 2(d) to form a doped polysilicon layer 14''' that comprises a mesa centered within, contiguous with and extending upward from a semiconductor material slab that contacts the buried oxide layer 12. In order to form from the doped polysilicon layer 14" within the schematic cross-sectional diagram of FIG. 2(d) from the doped polysilicon layer 14''' within the schematic cross-sectional diagram of FIG. 2(e), one will generally employ two photolithographic process steps. One photolithographic process step will generally be needed to form the slab and another photolithographic process step will generally be needed to form the mesa which comprises the ring waveguide in accordance with the embodiment. Each of the photolithographic process steps will generally also use a chlorine containing etchant gas composition. Within the schematic cross-sectional diagram of FIG. 2(e), the resulting mesa will thus have a linewidth of the ring waveguide, as described above, and a thickness to the top of the slab as also described above. In addition, the slab portions of the doped polysilicon layer 14''' will typically have a thickness from about 30 to about 60 nanometers. A strip waveguide in accordance with FIG. 1(a) and FIG. 1(b) may also be located and formed over the substrate 10 either simultaneously with, or separately from, the doped polysilicon layer 14".

Figure 2F:
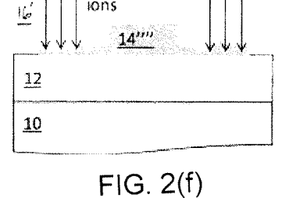

FIG. 2(f) shows the results of implanting n+ and p+ diode contact regions into portions of the contiguous polysilicon slab that are separated by the mesa within the doped polysilicon layer 14''' that is illustrated in FIG. 2(e) to in-turn provide a doped polysilicon layer 14''''. In accordance with discussion above, each of the n+ and p+ more heavily doped regions has a dopant concentration from greater than about 1E18 to about 1E22 dopant atoms per cubic centimeter.

Figure 2G:
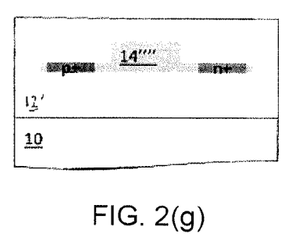

FIG. 2(g) in particular shows the results of encapsulating the silicon photonic photodiode structure of FIG. 2(f) while using a silicon oxide material layer generally similar with the buried oxide layer 12 to form an encapsulating passivating layer 12' that completely encapsulates the doped polysilicon layer 14''''. Intended within the schematic cross-sectional diagram of FIG. 2(g) is a thickness of silicon oxide materials about 3 microns below and about 1 micron above the doped polysilicon layer 14''''. This additional layer of silicon oxide material may be formed using methods including but not limited to chemical vapor deposition methods and physical vapor deposition methods. Typically, the additional layer of silicon oxide material is formed using a plasma enhanced chemical vapor deposition method. Also desirable in an annealing of the silicon photonic photodiode structure of FIG. 2(g) within an inert atmosphere such as but not limited to a nitrogen atmosphere under conditions such as but not limited to about 30 minutes at 600 degrees centigrade, 15 minutes at 900 degrees centigrade and 15 seconds at 1050 degrees centigrade.

Figure 2H:
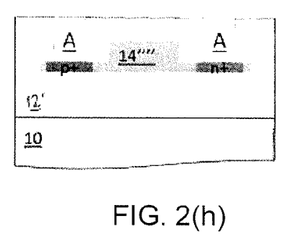

FIG. 2(h) shows the results of locating and forming a plurality of apertures A through the passivating material layer 12' and exposing the p+ and n+ contact regions within the doped polysilicon layer 14''''. The foregoing apertures A may be formed using photolithographic and etch methods as are otherwise generally conventional in the silicon photonic fabrication art, and in particular within the optoelectronic fabrication art.

Figure 2I:
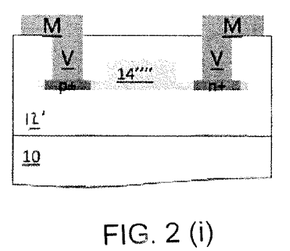

Finally, FIG. 2(i) shows the results of locating and forming into the apertures A that are illustrated in FIG. 2(h) vias V which contact the p+ and n+ doped regions within the doped polysilicon layer 14'''', to which vias V are located and formed metallization layers M, to thus provide a finished silicon photonic photodiode structure in accordance with the embodiments. Within the context of the schematic cross-sectional diagram of FIG. 2(*i*) often but not exclusively the vias V comprise a silicide material, such as but not limited to a nickel silicide material, to provide a superior low contact resistance connection to the p+ and n+ doped regions located and formed within the doped polysilicon layer 14''''. Typically, the vias V also comprise barrier layers and conductor layers that are also generally otherwise conventional, such as but not limited titanium, tantalum and tungsten metal and metal nitride based barrier layers and conductor layers. Finally, the metallization layers M typically also include conductor materials that are generally conventional, such conductor materials being selected from the group including but not limited to aluminum, aluminum alloy, copper and copper alloy conductor materials.

3. Photodetection Characteristics of the Silicon Photonic Photodiode Device

For accurate performance measurements of a silicon photonic photodiode device in accordance with the embodiments, the optical loss through a sample and test setup must be carefully measured to determine accurate values of internal detector responsivity. Such measurements were performed by coupling light into a strip waveguide using a tapered lensed fiber and collecting the waveguide output with an objective lens. A polarization controller was used before the chip to select the TM polarization, and a polarization filter was used after the chip. One may calculate the waveguide propagation loss to be $\alpha_{wg}=34.6$ dB/cm by launching light onto the chip from either direction as follows. Launching from the first facet, one may find the photocurrent on resonance to be $I_1=RP_{in1}C_{in}(\exp(-\alpha_{wg}L_1))(1-T_{min})$, and launching from the other facet one may we find $I_2=RP_{in2}C_{in}(\exp(-\alpha_{wg}L_2))(1-T_{min})$, where R is the internal responsivity, $P_{in1}(P_{in2})$ is the power at the fiber tip for facet 1(facet 2), $C_{in}$ is the fiber-to-chip coupling efficiency, $L_1(L_2)$ is the propagation distance from facet 1(facet 2) to the device, $T_{min}$ is the on-resonance extinction ratio, and $(1-T_{min})$ is the fraction of power dropped into the ring. The equations reduce to $I_1/I_2=P_{in1}\exp(-\alpha_{wg}L_1)/P_{in2}\exp(-\alpha_{wg}L_2)$, and one may solve for $\alpha_{wg}=34.6$ dB/cm, which is primarily due to scattering but also includes useful absorption. Then, by measuring the total chip insertion loss and subtracting the propagation loss, one may find the total chip coupling loss (input facet plus output facet) to be 12.9 dB. One may conservatively assume half of this coupling loss to be at the input facet. Additionally, there is 1.8 dB propagation loss from facet 1 to the device, resulting in a total loss of 8.3 dB between the fiber tip and the device for the following measurements.

Figure 3A:
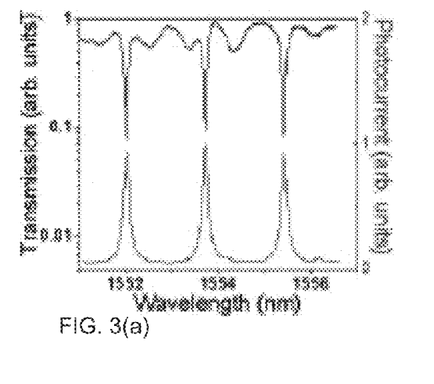
FIG. 3(a) shows a Transmission versus Wavelength and a Photocurrent versus Wavelength spectrum of a silicon photonic photodiode device in accordance with the embodiments.
Figure 3B:
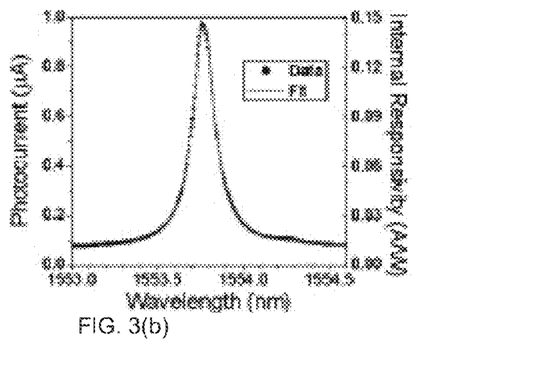
FIG. 3(b) shows a close scan at resonance spectrum of Photocurrent versus Wavelength and Responsivity versus Wavelength for a silicon photonic photodiode device in accordance with the embodiments.

The internal responsivity of the silicon photonic photodiode device in accordance with the embodiments was determined to be as high as 0.15 A/W. FIG. 3(*a*) shows the transmission and measured photocurrent when one sweeps the laser wavelength with a dc reverse bias on the silicon photonic photodiode device. When light is on resonance and trapped in the ring waveguide portion of the silicon photonic photodiode device, it either scatters away or it is absorbed and generates photocurrent. FIG. 3(*b*) shows the resonant photocurrent at −13 V. The optical power in the strip waveguide (i.e., bus waveguide) at the device is $P_{wg}=7.35$ μW, and the transmission extinction ratio is $(1-T_{min})\times100\%=90.5\%$, so $P_{det}=(1-T_{min})\times P_{wg}=6.65$ μW is coupled into the resonator. Observed was a quality factor Q=10,500 and a maximum photocurrent I=0.975 μA corresponding to internal responsivity R=0.15 A/W. The micro-ring waveguide silicon photonic photodiode device acts as a wavelength-selective photodetector, which can both de-multiplex and photodetect one wavelength of a WDM signal. This combined functionality is not possible in strongly absorbing materials where high loss would prevent the formation of a high-Q resonance.

The responsivity of the silicon photonic photodiode device was determined by the efficiency of both carrier generation (given by the ratio of absorption loss to total propagation loss in polysilicon) and carrier extraction. The absorption may be considered to be due to dangling bonds, which produce a distribution of trap states slightly below the midbandgap energy, many of which are filled by donor electrons. It is likely that, in the silicon photonic photodiode device in accordance with the embodiments, the photocarrier generation is primarily due to the n-phosphorus donor electrons being promoted from these trap states to a conduction band.

Figure 3C:
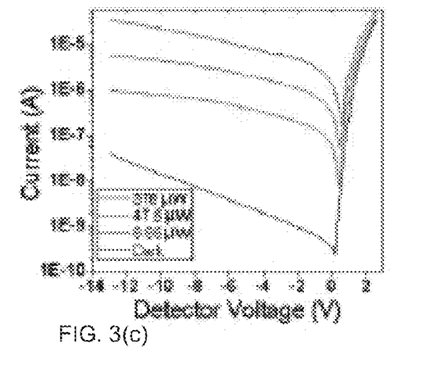
FIG. 3(c) shows Current versus Voltage characteristics under dark and light conditions for a silicon photonic photodiode device in accordance with the embodiments at various optical powers coupled into the silicon photonic photodiode device.
Figure 3D:
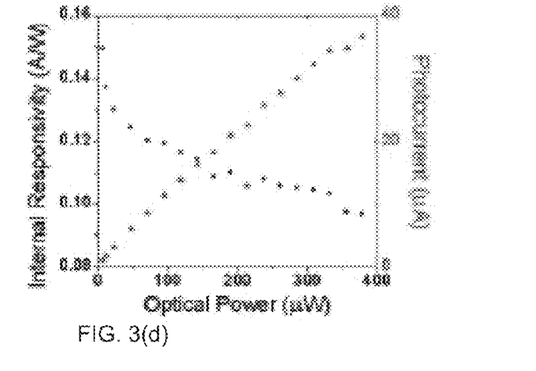
FIG. 3(d) shows Responsivity versus Optical Power and Photocurrent versus Optical Power characteristics for a silicon photonic photodiode device in accordance with the embodiments.

Also measured for the silicon photonic photodiode device in accordance with the embodiments was a low dark current of 40 nA at an operating voltage of −13 V. FIG. 3(*c*) shows current-voltage curves with and without light coupled to the silicon photonic photodiode device with the wavelength on resonance. The photocurrent does not plateau but rather continues increasing with reverse bias voltage. This effect can likely be improved by placing contacts closer to where the carriers are generated or by tailoring the dopant concentration to ensure full depletion of the waveguide region. It was observed that the silicon photonic photodiode device in accordance with the embodiments was not operating in an avalanche regime, which would otherwise produce a rapidly increasing dark current for V<−14 V. FIG. 3(*d*) shows responsivity as a function of the optical power coupled into the silicon photonic photodiode device at a bias voltage of −13 V. One may observe that the internal responsivity decreases from 0.15 A/W to 0.10 A/W as the optical power is increased over nearly 2 orders of magnitude. This decrease presumably indicates that either the generation or extraction of carriers is suppressed at higher photocarrier densities in the silicon photonic photodiode device and that these effects are larger than any two-photon absorption effect, which would otherwise increase the responsivity.

Figure 4A:
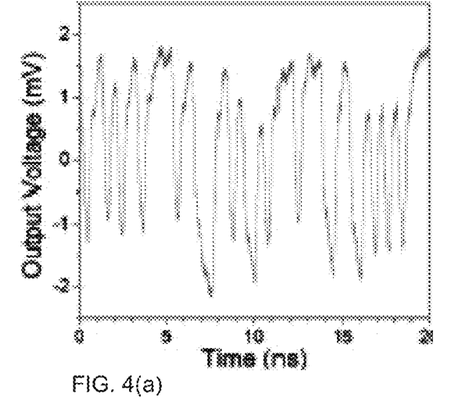
FIG. 4(a) show a direct AC output Voltage versus Time spectrum of a silicon photonic photodiode device in accordance with the embodiments.
Figure 4B:
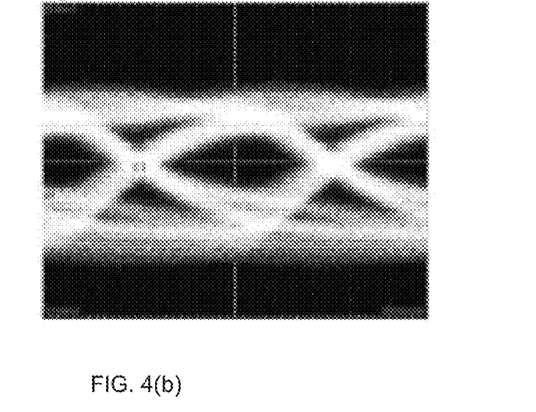
FIG. 4(b) shows an amplified electrical output eye diagram for a silicon photonic photodiode device in accordance with the embodiments.

The transient response of the silicon photonic photodiode device was also measured by modulating a cw laser with an external modulator. FIG. 4(*a*) shows the direct output of the silicon photonic photodiode device operating at a bit rate of 2.5 Gbps. To obtain an eye diagram, the silicon photonic photodiode device output was amplified with a low-noise amplifier with 1 GHz bandwidth. An open eye diagram a 1 Gbps is shown in FIG. 4(*b*). The silicon photonic photodiode device S11 response was measured using an HP8722ES vector network analyzer and the speed of the relatively large device was RC-limited. A circuit model and parameter fit was used to de-embed the parasitic contribution of contact pads, and the junction capacitance was observed to be 100 fF+/−7 fF and series resistance was observed to be 524Ω+/−25Ω. From those values, one may determine the electrical bandwidth of the silicon photonic photodiode device and pads terminated into a 50 Ω load to be 2.6+/−0.24 GHz, which can be improved by engineering the device structure, reducing the size of the resonator, or integrating directly with a transimpedance amplifier.

The absorption coefficient $\alpha_{abs}$ was calculated to be >=6 dB/cm inside the device. The use of a near critically coupled resonator photodiode is equivalent to a long waveguide photodiode; photons in the cavity that do not scatter away must be absorbed. The measured quantum efficiency QE=12% (for R=0.15 A/W at λ=1.55 μm) is therefore a lower bound for $\alpha_{abs}/\alpha_{ring}$, the percent of propagation loss in the ring which is due to absorption. From the Q and extinction ratio, one may calculate the total propagation loss in the ring waveguide (absorption and scattering) to be $\alpha_{ring}$=51.7 dB/cm, and the absorption coefficient is therefore $\alpha_{abs}$>/=6.2 dB/cm. One may consider that the actual absorption value is higher by the percentage of carriers that recombine before being extracted to the external circuit. Additionally, an identical photodiode integrated into a straight waveguide instead of a resonator could have a maximum QE=$\alpha_{abs}/\alpha_{wg}$=(6.2 dB/cm)/(34.6 dB/cm)=18%, based on the measured straight waveguide loss. The responsivity can be enhanced by optimizing the background dopant type and concentration.

4. Alternative Embodiments

While the silicon photonic photodiode structure as described above within the context of a strip waveguide and an optically coupled ring waveguide is illustrative as an embodiment, such a silicon photonic photodiode structure is nonetheless also not limiting of the embodiments. In that regard, FIG. 5a and FIG. 5b, FIG. 6a and FIG. 6b, FIG. 7a and FIG. 7b, FIG. 8a and FIG. 8b, and FIG. 9a and FIG. 9b show a series of schematic perspective-view diagrams and corresponding schematic cross-sectional view diagrams illustrating additional silicon photonic photodiode structure embodiments.

Figure 5A:
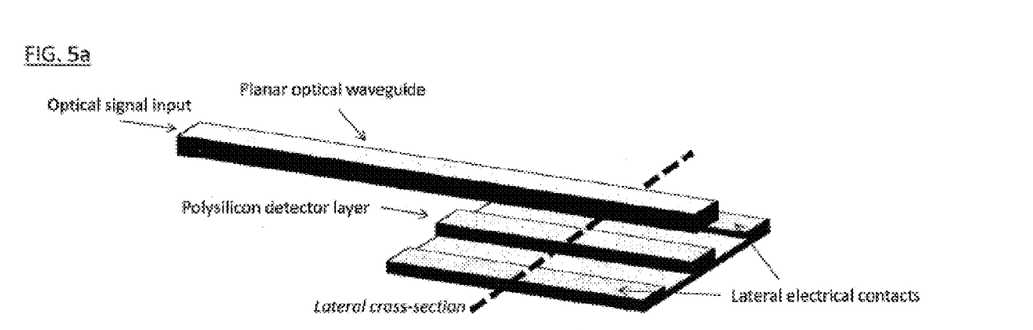
FIG. 5(a) and FIG. 5(b) show, respectively, a schematic perspective-view diagram and a schematic cross-sectional diagram of a silicon photonic photodiode structure in accordance with a first additional embodiment.
Figure 5B:
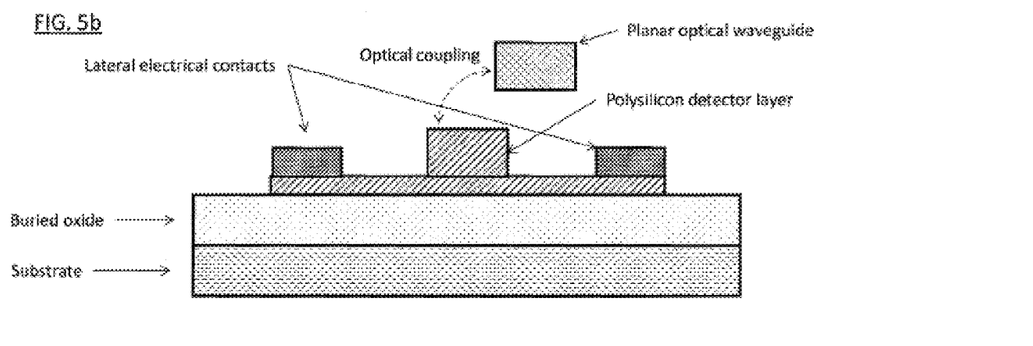

For example, FIG. 5a and FIG. 5b show, respectively, a schematic perspective-view diagram and a schematic cross-sectional view diagram of a silicon photonic photodiode structure in accordance with a first additional embodiment.

FIG. 5a in a first instance shows a planar optical waveguide which is intended as illustrative of the strip waveguide that is illustrated in FIG. 1a. FIG. 5a also shows a polysilicon detector layer which is located and formed upon a semiconductor material slab, upon which semiconductor material slab is also located and formed lateral electrode contacts that are separated by the polysilicon detector layer.

FIG. 5b shows a schematic cross-sectional diagram corresponding with the silicon photonic photodiode structure whose schematic perspective-view diagram is illustrated in FIG. 5a.

FIG. 5b shows a substrate having located and formed thereupon a buried oxide layer in turn having located and formed thereupon the semiconductor material slab upon which is located and formed the polysilicon detector layer that separates the lateral electrode contacts. FIG. 5b finally illustrates the planar optical waveguide optically coupled to the polysilicon detector layer.

Figure 6A:
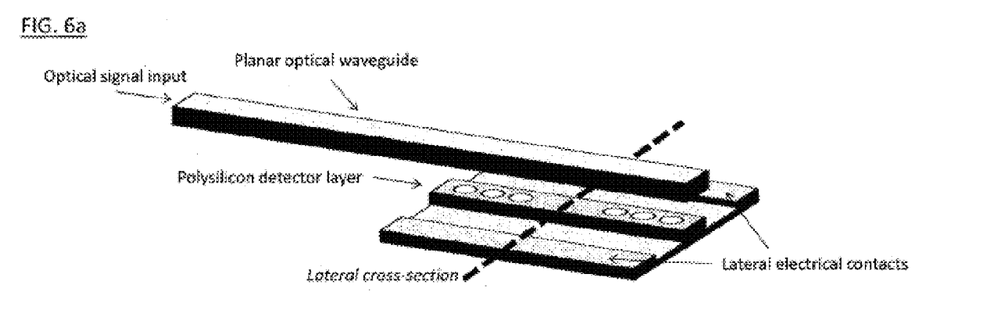
FIG. 6(a) and FIG. 6(b) show, respectively, a schematic perspective-view diagram and a schematic cross-sectional diagram of a silicon photonic photodiode structure in accordance with a second additional embodiment.
Figure 6B:
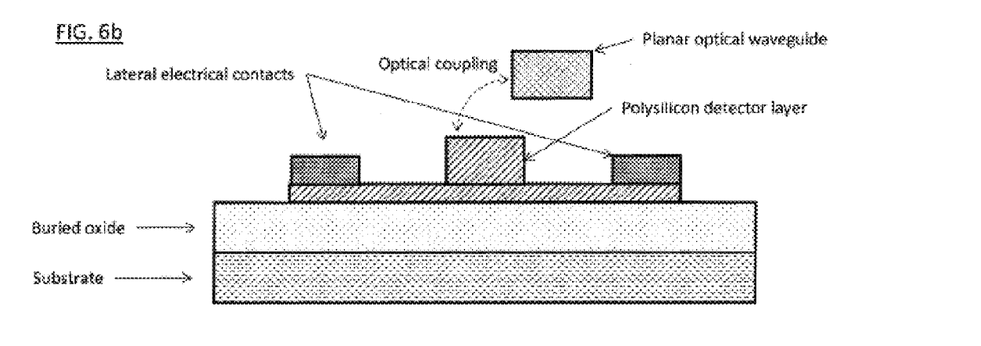

FIG. 6a and FIG. 6b show a schematic perspective-view diagram and a schematic cross-sectional view diagram that otherwise relate to the schematic perspective-view diagram and schematic cross-sectional view diagram of FIG. 5a and FIG. 5b, but wherein the polysilicon detector layer further comprises apertures or holes. Due to the presence of such apertures or holes, the polysilicon detector layer functions as a photonic crystal which enhances the photodetection properties of the polysilicon detector layer.

Figure 7A:
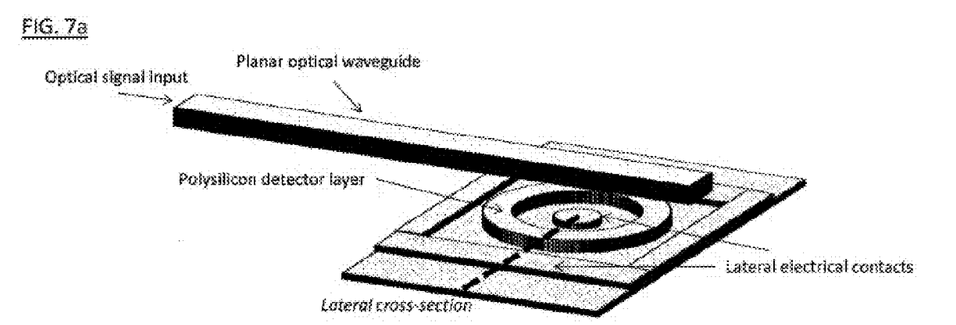
FIG. 7(a) and FIG. 7(b) show, respectively, a schematic perspective-view diagram and a schematic cross-sectional diagram of a silicon photonic photodiode structure in accordance with a third additional embodiment.
Figure 7B:
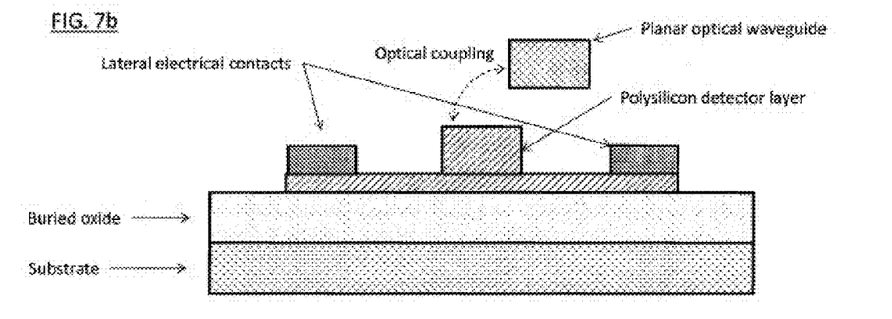

FIG. 7a and FIG. 7b show a schematic perspective-view diagram and a schematic cross-sectional view diagram of a silicon photonic photodetector structure in accordance with yet another embodiment.

FIG. 7a shows a schematic perspective-view diagram of a silicon photonic photodiode structure similar in a first instance with the silicon photonic photodiode structure in accordance with FIG. 1a and FIG. 1b, but wherein the planar optical waveguide that corresponds with the strip waveguide that is illustrated in FIG. 1a is in fact located and formed above or over the polysilicon detector layer rather than laterally separated from the polysilicon detector layer.

Figure 8A:
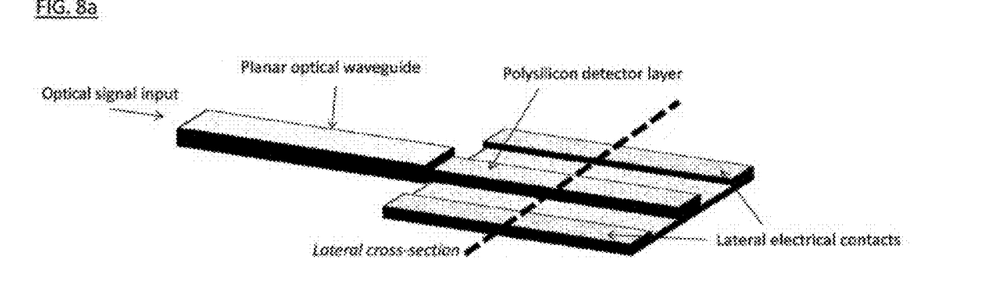
FIG. 8(a) and FIG. 8(b) show, respectively, a schematic perspective-view diagram and a schematic cross-sectional diagram of a silicon photonic photodiode structure in accordance with a fourth additional embodiment.
Figure 8B:
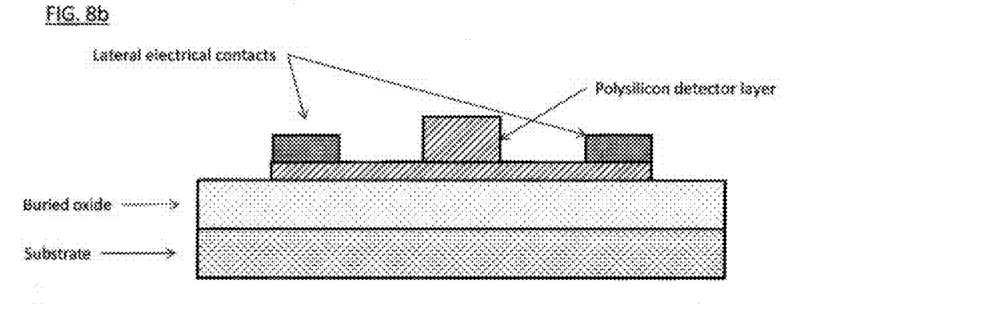

The schematic cross-sectional diagram of FIG. 7b corresponds generally, if not necessarily exactly, with the schematic cross-sectional diagram of FIG. 6b or the schematic cross-sectional diagram of FIG. 5b, FIG. 8a and FIG. 8b show a schematic perspective-view diagram and a schematic cross-sectional diagram of a silicon photonic photodetector structure in accordance with yet another embodiment.

FIG. 8a and FIG. 8b show a schematic perspective-view diagram and a schematic cross-sectional diagram of a silicon photonic photodetector structure analogous with the silicon photonic photodetector structure whose schematic perspective-view diagram and cross-sectional view diagrams are illustrated in FIG. 5a and FIG. 5b, but wherein the planar optical waveguide and the polysilicon detector layer are butt connected as a form of optical coupling rather than, for example and without limitation, separated and evanescently optically coupled.

Figure 9A:
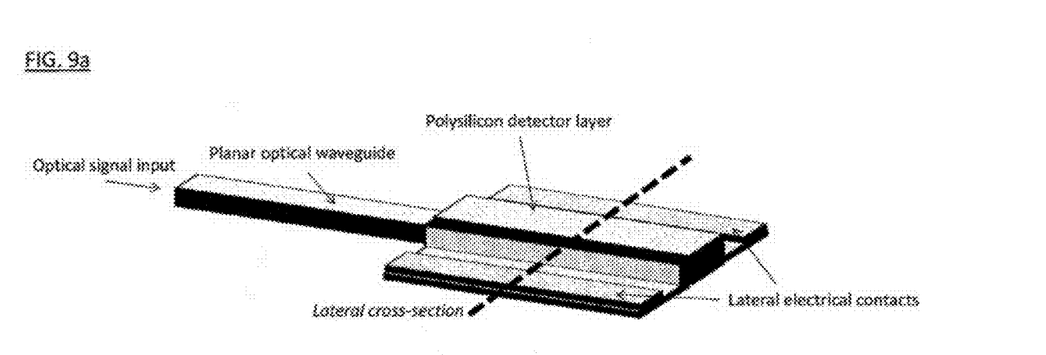
FIG. 9(a) and FIG. 9(b) show, respectively, a schematic perspective-view diagram and a schematic cross-sectional diagram of a silicon photonic photodiode structure in accordance with a fifth additional embodiment.
Figure 9B:
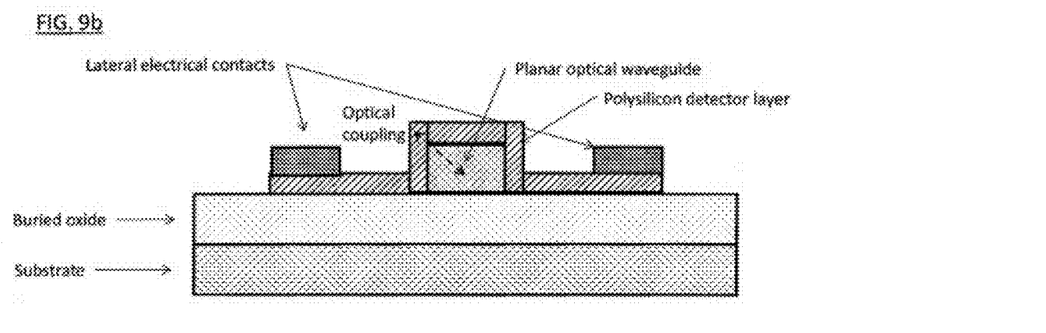

FIG. 9a and FIG. 9b show a schematic perspective-view diagram and a schematic cross-sectional diagram of a silicon photonic photodetector structure in accordance with yet another embodiment.

FIG. 9a and FIG. 9b relate generally to FIG. 8a and FIG. 8b, but wherein the polysilicon detector layer is formed nominally conformal to the planar optical waveguide. Under these circumstances, alternate sub-embodiments exist which may or may not include a dielectric layer interposed between the planar optical waveguide and the polysilicon detector layer. As well, while the slab portions of the semiconductor material slab still exist, they are now connected to form an n shaped cross-section polysilicon detector layer rather than a rectangular cross-sectioned polysilicon detector layer.

Figure 10A:
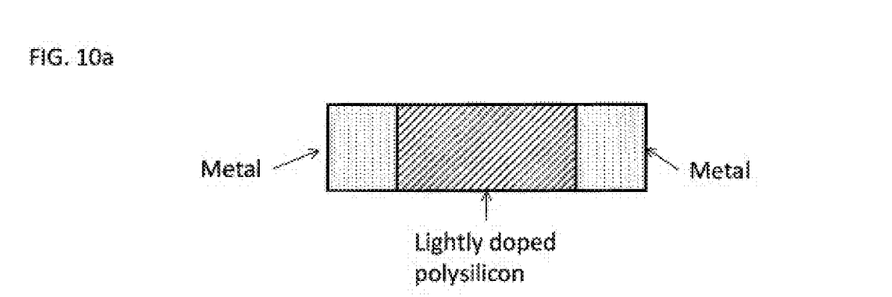
FIG. 10(a) and FIG. 10(b) show a pair of metallization schemes that may be used in fabricating a silicon photonic photodiode structure in accordance with the embodiments.
Figure 10B:
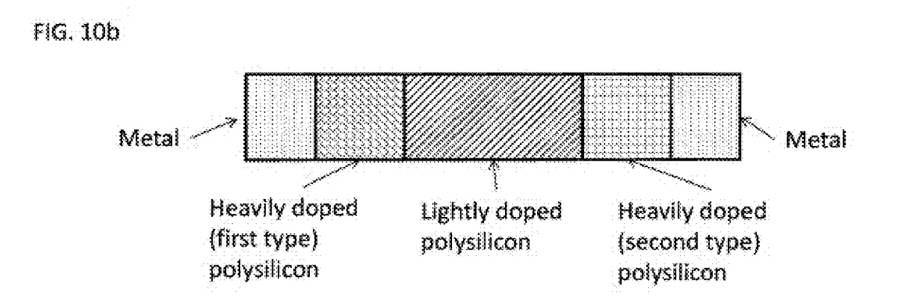

FIG. 10a and FIG. 10b show a pair of metallization structures that may also be used for forming a silicon photonic photodiode structure in accordance with the embodiments.

Illustrated in FIG. 10a is a metal-semiconductor-metal (MSM) structure that uses a lightly doped polysilicon central portion which is contacted or capped at each end with a metal (i.e., which may be the same metal). The metal and the lightly doped semiconductor materials may be the same as the metals and the lightly doped semiconductor materials that is discussed above within the context of the particular described first embodiment.

In contrast, FIG. 10b shows a metallization structure that includes a lightly doped polysilicon central portion to which is laminated heavily doped polysilicon material layers of a first type and a second type, to which in turn is laminated metal lateral layers. As is understood by a person skilled in the art, FIG. 10b differs from FIG. 10a by the presence of the heavily doped polysilicon materials layers of the first type and of the second type. Thus, within the context of FIG. 10a a silicon photonic polysilicon photodiode structure in accordance with the embodiments may include solely a metal-doped silicon-metal structure.

Common to all embodiments is thus a lightly doped polysilicon material layer as a photodiode photodetector material layer within a silicon photonic photodiode structure. The embodiments contemplate that metallization electrical contacts may be formed directly to the lightly doped polysilicon material, as well as to more highly doped polysilicon material layers or polysilicon material regions.

The silicon photonic polysilicon photodetector structure presented here can be integrated with CMOS SOI optical components for optical interconnect applications. However, these results also open the door to an integrated optical link which does not require any crystalline SOI material, but utilizes only silicon-based materials deposited in the CMOS stack. Desirably, both a modulator and a photodetector can be fabricated from the same polysilicon material. Absorption can presumably be suppressed in the modulator regions by hydrogen passivation and enhanced in the detector regions by optimizing the dopant type and concentration. Additionally, propagation loss in deposited silicon nitride has been demonstrated as low as 0.1 dB/cm, approximately 20 times better than losses in single-mode submicrometer crystalline SOI waveguides. Because of the ultralow optical loss, it may be possible to design optical links or networks whose system-level characteristics outperform the traditional SOI platform, even with some degradation in modulator and detector device performance as compared to SOI and crystalline Ge-on-Si.

In conclusion, demonstrated is an integrated silicon photonic photodiode structure, method and device in polysilicon, a deposited CMOS material. The polysilicon exhibits 6 dB/cm absorption, which results in a responsivity of 0.15 A/W. Demonstrated was 2.5 Gbps operation of the device and suggested was several areas of research for achieving devices with even higher performance.

All references, including publications, patent applications, and patents cited herein are hereby incorporated by reference in their entireties to the same extent as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A photonic structure comprising:
   a strip waveguide located over a substrate;
   a polysilicon material photodetector layer in the form of a comparatively lightly doped ring resonator mesa that separates a pair of lower lying plateaus also located over the substrate, the comparatively lightly doped ring resonator mesa being optically coupled with the strip waveguide; and
   a pair of p/n comparatively heavily doped electrical contact regions electrically coupled with the pair of lower lying plateaus, where the pair of p/n comparatively heavily doped electrical contact regions and the comparatively lightly doped ring resonator mesa comprise a horizontal diode.

2. The photonic structure of claim 1 wherein the strip waveguide is laterally separated from the polysilicon material photodetector layer.

3. The photonic structure of claim 1 wherein:
   the polysilicon material photodetector layer is contiguous with a semiconductor material slab also located over the substrate; and
   the polysilicon material photodetector layer and the semiconductor material slab comprise the same polysilicon material.

4. The photonic structure of claim 2 wherein the semiconductor material slab and the polysilicon material photodetector layer have a dopant concentration from about 1e14 to less than about 1e18 dopant atoms per cubic centimeter.

5. The photonic structure of claim 4 wherein:
   one of the pair of p/n comparatively heavily doped semiconductor regions comprises a p+ dopant at a concentration from greater than about 1E18 to about 1E22 dopant atoms per cubic centimeter; and
   the other of the pair of p/n comparatively heavily doped semiconductor regions comprises an n+ dopant at a concentration from greater than about 1E18 to about 1E22 dopant atoms per cubic centimeter.

6. The photonic structure of claim 1 wherein the polysilicon material photodetector layer does not include germanium.

7. The photonic structure if claim 1 further comprising circuitry located over the substrate and connected to the pair of p/n comparatively heavily doped electrical contacts, and adapted to detect an electrical output signal using at least one of the pair of p/n comparatively heavily doped electrical contact regions when introducing an optical signal at the strip waveguide.

8. The photonic structure of claim 1 wherein the polysilicon material photodetector layer includes defect states suitable for absorbing an optical signal from the strip waveguide and generating an electrical output signal using at least one of the electrical contacts when the optical signal includes a photon energy less than a band gap energy of a polysilicon material from which is comprised the polysilicon material photodetector layer.

9. A method for fabricating a photonic device comprising:
   forming over a substrate a strip waveguide;
   forming over the substrate a polysilicon material photodetector layer in the form of a comparatively lightly doped ring resonator mesa optically coupled with the strip waveguide and separating a pair of lower lying plateaus; and
   forming over the substrate and coupled with the pair of lower lying plateaus a pair of p/n comparatively heavily doped electrical contact regions, where the pair of p/n comparatively heavily doped contact regions and the comparatively lightly doped mesa comprise a horizontal diode.

10. The method of claim 9 wherein the strip waveguide and the polysilicon material photodetector layer are formed simultaneously.

11. The method of claim 9 wherein the polysilicon material photodetector layer does not include germanium.

12. The method of claim 9 further comprising forming over the substrate and connected to the pair of p/n comparatively heavily doped electrical contact regions circuitry adapted to detect an electrical output signal using at least one of the pair of p/n comparatively heavily doped electrical contact regions when introducing an optical signal at the strip waveguide.

13. The method of claim 9 wherein the polysilicon material photodetector layer is formed with defect states suitable for absorbing an optical signal from the strip waveguide and generating an electrical output signal using at least one of the electrical contacts when the optical signal includes a photon energy less than a band gap energy of a polysilicon material from which is comprised the polysilicon material photodetector layer.

14. A method for operating a photonic device comprising: providing a photonic structure comprising:
a strip waveguide located over a substrate;
a polysilicon material photodetector layer in the form of a comparatively lightly doped ring resonator mesa that separates a pair of lower lying plateaus also located over the substrate, the comparatively lightly doped ring resonator mesa being optically coupled with the strip waveguide; and
a pair of p/n comparatively heavily doped electrical contact regions coupled with the pair of lower lying plateaus, where the pair of p/n comparatively heavily doped electrical contact regions and the comparatively lightly doped mesa comprise a horizontal diode;
introducing an optical signal into the strip waveguide; and
measuring the electrical output signal while using the at least one of the p/n comparatively heavily doped electrical contact regions.

15. The method of claim 14 wherein the photonic structure further comprises circuitry adapted to detect an electrical output signal using at least one of the pair of p/n comparatively heavily doped electrical contact regions when introducing an optical signal at the strip waveguide.

16. The method of claim 14 wherein the polysilicon material photodetector layer including defect states suitable for absorbing an optical signal from the strip waveguide and generating an electrical output signal using at least one of the electrical contacts when the optical signal includes a photon energy less than a band gap energy of a polysilicon material from which is comprised the polysilicon material photodetector layer.

17. The method of claim 14 wherein when introducing the optical signal into the strip waveguide, the optical signal includes a photon energy less than a bandgap of the polysilicon material from which is comprised the polysilicon material photodetector layer.

18. The method of claim 14 wherein the polysilicon material photodetector layer does not comprise germanium.

19. The method of claim 14 wherein the measuring the photodetected signal uses both the electrical contacts.

20. The method of claim 14 further comprising electrically biasing at least one of the electrical contacts.

21. The method of claim 14 wherein the signal is a multiplexed signal.

22. The method of claim 14 wherein the multiplexed signal is demultiplexed and photodetected.

\* \* \* \* \*